United States Patent
Bergmann et al.

[11] Patent Number: 6,015,998
[45] Date of Patent: Jan. 18, 2000

[54] FLEXIBILITY CONTROL IN OPTICAL MATERIALS

[75] Inventors: Ernest Eisenhardt Bergmann, Borough of Fountain Hill, Pa.; Gustav Edward Derkits, Jr., New Providence, N.J.

[73] Assignee: Lucent Technolgies, Inc., Murray Hill, N.J.

[21] Appl. No.: 08/992,638

[22] Filed: Dec. 17, 1997

[51] Int. Cl.[7] .................. H01L 31/0232; H01L 31/00
[52] U.S. Cl. ................ 257/446; 257/448; 257/618
[58] Field of Search .................. 257/447, 446, 257/448, 432, 622, 618

[56] References Cited

U.S. PATENT DOCUMENTS

| | | | |
|---|---|---|---|
| 4,133,152 | 1/1979 | Penrose | 52/105 |
| 4,943,710 | 7/1990 | Sakama et al. | 250/208.1 |
| 4,972,244 | 11/1990 | Buffet et al. | 257/446 |
| 5,426,626 | 6/1995 | Katayama | 369/44.41 |
| 5,536,964 | 7/1996 | Green et al. | 257/432 |
| 5,623,158 | 4/1997 | Frank et al. | 257/446 |
| 5,656,848 | 8/1997 | Beratan et al. | 257/446 |
| 5,714,773 | 2/1998 | Burrows et al. | 257/82 |

*Primary Examiner*—Donald L. Monin, Jr.

[57] ABSTRACT

In an optical material formed of strips of laminated methods, through channels or "trenches" are produced in at least one of the lamination materials in a manner that the material will then consist of "stiff islands" interspersed with flexible regions created by the properly created through channels. The trenching alows a strip to become piece-wise alignable, and also makes it flexible enough to bond it in alignment in a laminate, yet continuous enough to be handled as one sheet for initial placement. "Chain-like" capability can be provided by making the sheet into a form resembling a jig-saw puzzle where the chances of the individual pieces slipping apart is reduced using narrow, slanted trenches. Alternatively, "springy" flexibility can be provided by forming relatively long, thin, bent strips of material that support the islands of continuous sheet. The islands are thus allowed to move two dimensionally relative to each other. The springiness also provides for out-of-plane displacements to enable us to sequentially mechanically register array elements.

30 Claims, 5 Drawing Sheets

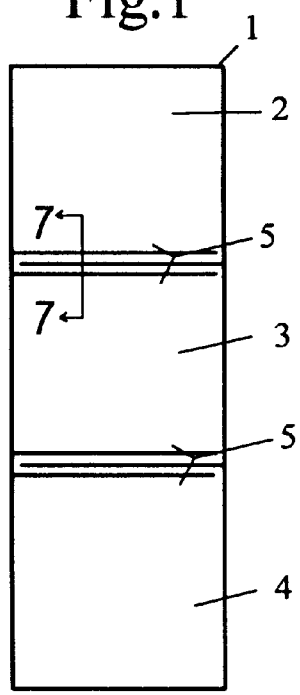
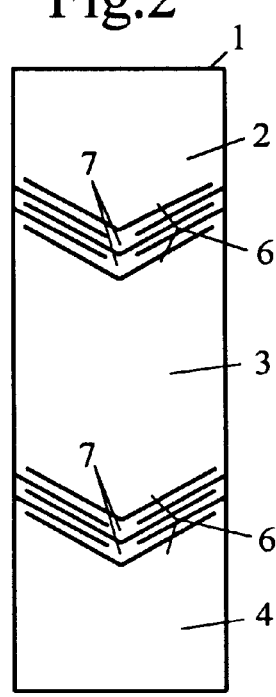
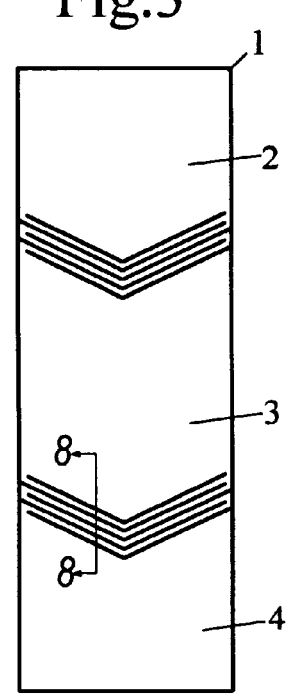
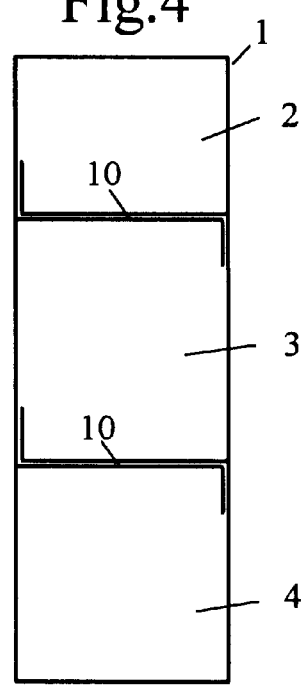
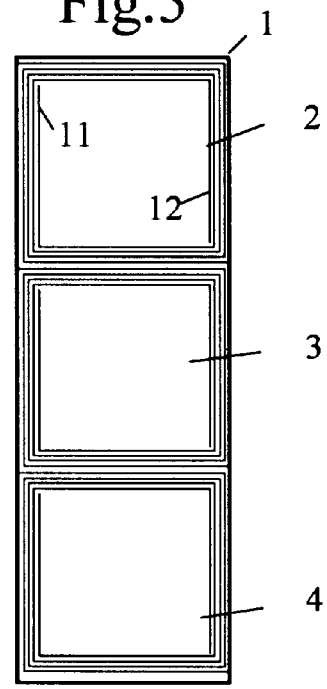
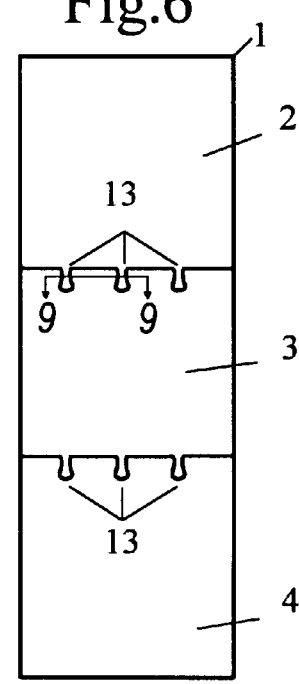

FLEXIBILITY CONTROL IN OPTICAL MATERIALS

FIELD OF THE INVENTION

The invention pertains to the field of fabrication of electro-optical materials. More particularly, the invention pertains to methods of fabrication of strips or arrays of electro-optical devices.

BACKGROUND OF THE INVENTION

Electro-optical devices include electronic, optical or electro-optical packages, integrated circuits, integrated optical circuits, Vertical Cavity Surface Emitting Lasers (VCSELs), edge emitting lasers, Light Emitting Diodes (LEDs), or various types of photodetectors. In addition to these active devices, passive optics such as apertures, lenses, mirrors, spacers, attenuators, diffractive elements, birefringent plates, Faraday rotators and fiber connectors are commonly used in the growing field of electro-optical devices.

In the mass manufacture of electro-optical devices, it is desirable to make strips or arrays of devices and to laminate these devices with layers of other devices or passive materials. Then, after lamination is complete, it is often desirable to separate the individual devices. In this way, handling and assembling devices is done en masse and not individually. Laminations (analogous to the laminated wood product commonly called plywood) require that the material of which the layers is made be flexible, or otherwise one has the danger of warping or breakage.

Further, in terminating fiber optic or integrated optic arrays one may wish to employ strips or arrays of material and devices with features that must maintain optical alignment.

Micro-optical technology is characterized by the requirement of micron-level alignment tolerances in hybrid IC's.

For example, VCSELs are generally fabricated in wafer form in two-dimensional arrays. Such an array may need to be mated to an array of individual lenses generated in a different material, say by Reactive Ion Etching (RIE).

Due to long term variations in lithographic dimensions and due to variations in temperature, the materials that are being fabricated may not "line-up" all the way from one end to the other end of the strip or across a two-dimensional array; or, if they are forced to line up everywhere, there may be a build up of stress.

Exact matching of thermal expansions of dissimilar materials is generally not possible. For example, the approximate coefficients of expansion for amorphous $SiO_2$, Quartz, Silicon, Rutile, and Garnet are 0, 7, 3.3, 7, and 9 ppm/° C., respectively. Given a temperature range of 60° C. and a length of 10 cm, a difference in expansion coefficient of only 4 ppm would produce an end-to-end misalignment of approximately 24 $\mu$m. In practice, only 1 $\mu$m misalignment can be tolerated in some applications.

The goal is to maintain the existence of strips, for purposes of easier handling, yet to make the strips flexible between regions of tight tolerance. For example, as shown in FIG. 17a, if the two parts (70) and (71) of a structure are to be mechanically registered using V-grooves (74), and if there are several (2–100, say) devices (71a)–(71d) having these V-grooves, manufactured in a continuous strip, then it is possible that the mechanical registration for any one or two devices (whose width may be only a few mm) will succeed, but that the many devices along the length of the strip will become progressively more unlikely to be in alignment. FIG. 17a exaggerates this misalignment for purposes of illustration.

In addition to the above problem, two-dimensional optical arrays can be made out of laminations of separately prepared materials where features on different levels of the laminate must remain precisely aligned even when the thermal expansion differs for each of the laminate materials or where there is a slight magnification error between layers.

Such slight dimensional imperfection is not sufficient to be a problem on any one array subsystem, but the ability to provide some flexibility of each group of features relative to the total array is required.

SUMMARY OF THE INVENTION

In an electronic or optical material, through channels or "trenches" are produced, in a laminated material in at least one of the lamination materials, in a manner that the material will then consist of "stiff islands" interspersed with flexible regions created by the properly created through channels.

The trenching alows a strip to become piece-wise alignable, and also makes it flexible enough to bond it in alignment in a laminate, yet continuous enough to be handled as one sheet for initial placement. "Chain-like" capability can be provided by making the sheet into a form resembling a jig-saw puzzle where the chances of the individual pieces slipping apart is reduced using narrow, slanted trenches.

Alternatively, "springy" flexibility can be provided by forming relatively long, thin, bent strips of material that support the islands of a continuous sheet, so that the islands are allowed to move two dimensionally relative to each other. The springiness also provides for out-of-plane displacements of the islands to enable sequential mechanical registration of array elements.

BRIEF DESCRIPTION OF THE DRAWING

FIG. 1 shows a basic application of the invention, with three rigid areas divided by two flexible areas formed of straight interdigitated trenches.

FIGS. 2 and 3 show embodiments of the invention using trenches arranged in chevrons.

FIG. 4 shows an embodiment using L-shaped trenches (forming S-shaped strips) to provide some flexibility in two dimensions.

FIG. 5 shows a further development of the embodiment of FIG. 4, in which the trenches are extended completely around the rigid sections.

FIG. 6 shows shows an embodiment of the invention in which the trenches are in the form of keys or dovetails.

DESCRIPTION OF THE PREFERRED EMBODIMENT

FIGS. 1 to 6 show a representative strip of devices, comprising two end sections (2) and (4) and one middle section (3). However it should be understood that the number of sections could vary from only two end sections separated by a single flexible region to a strip of any chosen length having an arbitrary number of intermediate sections. It is also not necessary that the two flexible regions be the same as shown in each of these drawings, although for many or most applications, the regions can be the same.

As the method of the invention may be used with a wide variety of electro-optical devices, as noted above, the actual devices are not shown in the figures. It will be understood by one skilled in the art that the devices, of whatever nature, will be located on the intermediary, relatively rigid sections between the flexible regions, and that the nature of the devices may vary widely within the teachings of the invention.

Figure 7:
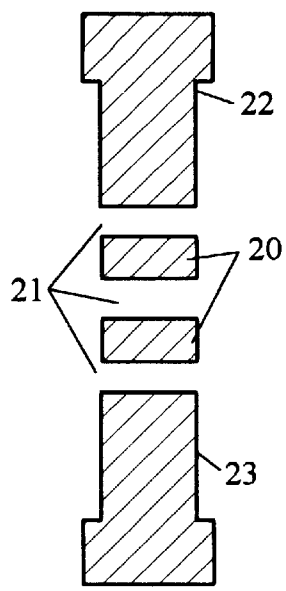
FIG. 7 shows a side cut-away view along the lines 7—7 in FIG. 1.

In FIG. 1 we see the basic embodiment of the invention in a strip of material (1), in which the relatively rigid sections of the material (2), (3) and (4) are separated by straight interdigitated trenches (5). Because of the flexible regions formed by the trenches (5), the strip can be stretched or slightly compressed along its length. The material is still continuously connected end-to-end, so it does remain as one strip and, unless abused with excessive force, does not fall apart. FIG. 7 shows a possible partial cut-away view of the embodiment of FIG. 1, along the lines 7—7.

The stiff sections (22) and (23) are held together by the thin strips of material (20) formed between the interdigitated through channels (21). The relative motion between sections is largely confined along the long axis of the strip. This limitation on motion is a result of the relative ease of bending or flexing of the thin strips of material compared to stretching or compressing these strips. Also, the regions of attachment of the thin strips may act like hinges. Slight changes in the hinge angles also result in motions of the stiff areas primarily along the long axis of the strip.

The embodiment of FIG. 2 provides a relatively "stiff" coupling between sections but one with similar stiffness along the long axis of the strip and at right angles along the plane of the strip. In this embodiment, the trenches (6) are in a chevron or "V" arrangement, with pairs of trenches interrupted in the middle, leaving rigid sections (7) in between the interrupted trenches. The stiffness is due to the need to compress or stretch the thin strips of material between the trenches; flexure is insufficient to permit motion.

Figure 8:
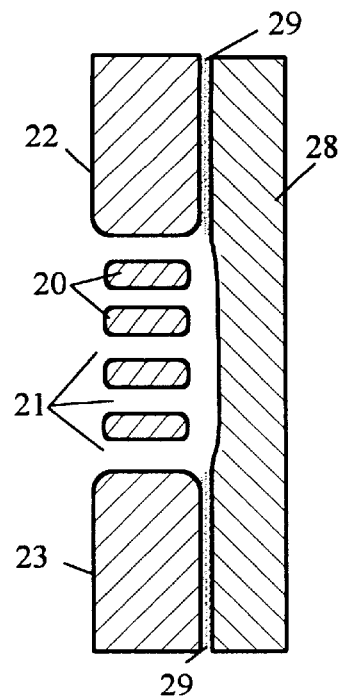
FIG. 8 shows a side cut-away view along the lines 8—8 in FIG. 3.

The embodiment of FIG. 3, in which the trenches are not interrupted, will be considerably less stiff between sections than that of FIG. 2, because flexure and/or hinging is sufficient for relative motion to occur. Relative motions in the plane of the strip can be both along and perpendicular to the long axis of the strip. The key to supporting both types of motions is the "bent" thin strips. FIG. 8 shows a possible partial cut-away view of the embodiment of FIG. 3, along the lines 8—8.

Where flexure is used (FIGS. 8 and 9), it is generally better to have the thin strips formed by the channels even thinner than the thickness of the original sheet of material. This type of cross-section makes the strip more flexible for bending in plane than out of plane. This anisotropic stiffness keeps the regions of stiffness more in plane (keeps them from going out of plane) than their relative positions in plane; the sheet will remain flatter.

Additionally, in the interests of using epoxy bonding, or at least to reduce the effects of friction in the flexible regions, it may be desirable to provide clearances for these flexible regions where the layers are not epoxy bonded. This can be seen in FIG. 8, where the epoxy (29) is shown between the rigid layer (28) and the rigid sections (22) and (23), but not in the flexible region of strips (20) and channels (21). The clearance could also be provided by etching back on layer (28) instead of, or in addition to, the clearance provided as shown.

One of many alternative designs with "bent" thin strips to support in plane motions in two dimensions is shown in FIG. 4, in which the trenches (10), in addition to extending transversely across the strip (1), also extends up the sides of the rigid sections (2), (3) and (4) in an "S"-shaped arrangement. One can further "loosen" the binding between the stiff portions by extending the ends of the "S-shaped" trenches to form more and more of a spiral. The spiral arms should intertwine to make the whole length of the strip flexible, not just the stiff regions flexible relative to a comparatively stiff lattice (unless that is what one wants, of course). An example of intertwined spirals is given by FIG. 5.

Instead of trying to provide a "springy" flexibility, one can provide a "chain-like" capability where each stiff region is totally free to move relative to the next stiff region up to some limit. Such an arrangement is shown in the embodiment of FIG. 6. In this embodiment, one can imagine each stiff region as being like a piece of a jig-saw puzzle, with loosely fitting pieces held together by "keys" or "dovetails" (13) formed into the trenches. One can reduce the chances of the pieces separating by one or another piece moving in a direction perpendicular to the drawing by using relatively narrow trenches.

Figure 9:
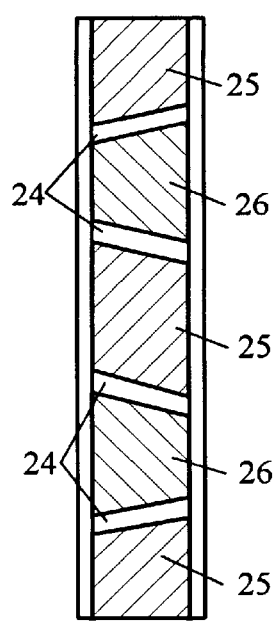
FIG. 9 shows a side cut-away view along the lines 9—9 in FIG. 6.

FIG. 9 shows a possible cross-sectional view through a pair of successive "dovetails" (13), along lines 9—9 in FIG. 6. By using slanted trenches (24) that alternatively slant in different directions, one can have the regions of stiffness unable to fall apart. The alternating directions of cross-hatching is used to emphasize which of two neighboring stiff regions (25) or (26) is being cut across.

All three drawings indicate that the regions of flexibility should be recessed (thinner) than the surface planes defined by the stiff regions. Epoxy can be confined by surface tension to the surfaces of the stiff regions and will not wick to the regions of flexibility. One also reduces the chance for binding or friction in the eventual laminate within the regions of intended flexibility. Alternatively, the recess of the surface could be on the opposite side of the epoxied surface pair, within the teachings of the invention.

In passing, it is good design to not form very sharp bends in the channels and enlarge the ends of the channels to control the minimum radius of curvature at bends and junctures of the thin material strips to help avoid crack formation and propagation in the material. This is shown in the dovetails (13) of FIG. 6, which are shown as smooth keyhole shapes, rather than having sharp corners. Smooth rounded inside corners can also be seen in FIG. 18.

The invention can also be used in embodiments in which the rigid regions are arranged two-dimensionally in arrays, rather than just in lengthwise strips as has been discussed to this point.

Figure 10:
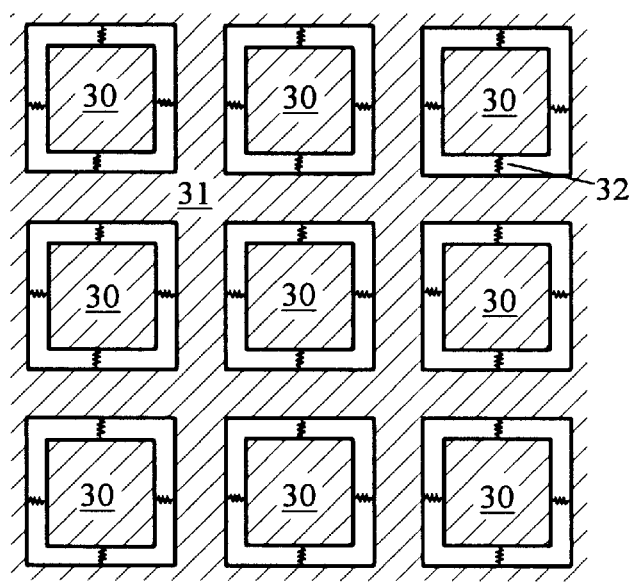
FIGS. 10 and 11 show schematic representations of latticed and unlatticed arrays, for discussion purposes.

In understanding these two-dimensional embodiments, it is important to understand the conceptual distinction between "latticed" and "unlatticed" arrays. In a latticed array, shown schematically in FIG. 10, although we provide islands (30) which are individually flexibly attached (shown schematically by springs (32), they are flexibly attached to a lattice (31) that itself is relatively inflexible.

Although the array is shown as square-like, it could be less regular or it could be regular with different spacings in the two principal directions. The two principal directions, if they exist, need not be orthogonal; for example, they could be like brick-work, hexagonal, or even Penrose tiled (Roger Penrose, U.S. Pat. No. 4,133,152, "Set of Tiles Covering a Surface").

Figure 12:
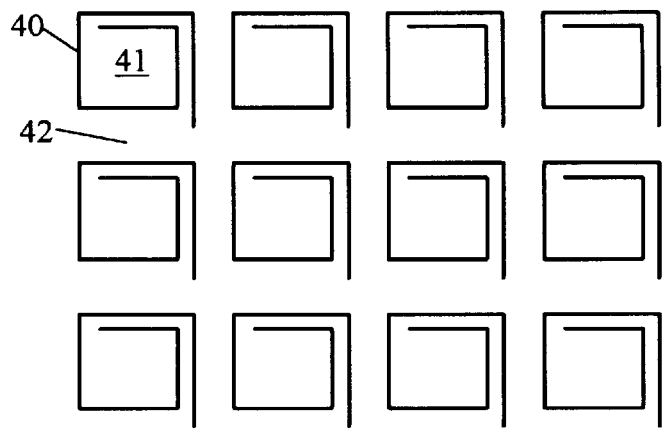
FIG. 12 shows an embodiment of the invention, used in a two-dimensional latticed array.

We have indicated the flexible connections very schematically as "wire springs". To achieve a similar flexibility in 2 dimensions we can form an array of spiral trenches, as shown in FIG. 12.

We have drawn the spiral trenches (40) with the minimum two leg connection between the approximately square islands (41) and the surrounding lattice (42). To increase the flexibility, we could make the connecting legs thinner or longer (by increasing the spiral trench accordingly). It is, of course, not necessary that the regions be square or that they be arranged in a square (nor even regular) array. Of course, we could use gently curved trenches. The spirals could be approximately circular.

Figure 11:
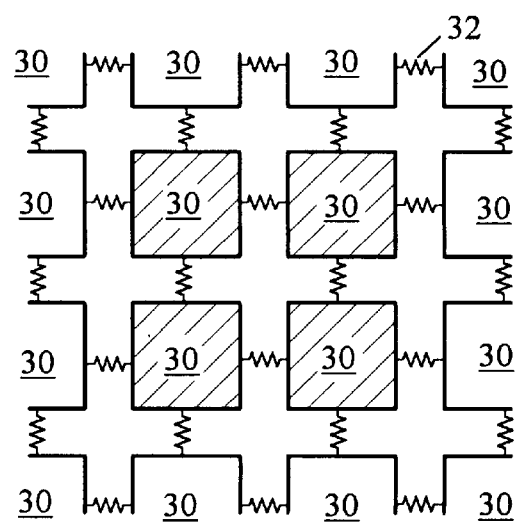

Because of the inflexibility of the lattice, we prefer the unlatticed flexible array, shown schematically in FIG. 11. In such an arrangement, the rigid islands (30) are flexibly attached to each other, rather than to an inflexible lattice. As in FIG. 10, the flexible connections are indicated very schematically as "wire springs" (32).

Although the array is shown as square-like, it could be less regular or it could be regular with different spacings in the two principal directions. The two principal directions, if they exist, need not be orthogonal, and the regions that are interconnected need not all be the same.

It will be understood by one skilled in the art that, while the shapes of the islands are referred to herein as simply "triangular", "rectangular" or "hexagonal" or the like, that these terms are approximations in practical terms. Imperfections introduced by connection of strips, radialized bends, manufacturing variations and material considerations will make the shapes of the islands vary from the ideal, within the teachings of the invention.

Figure 13:
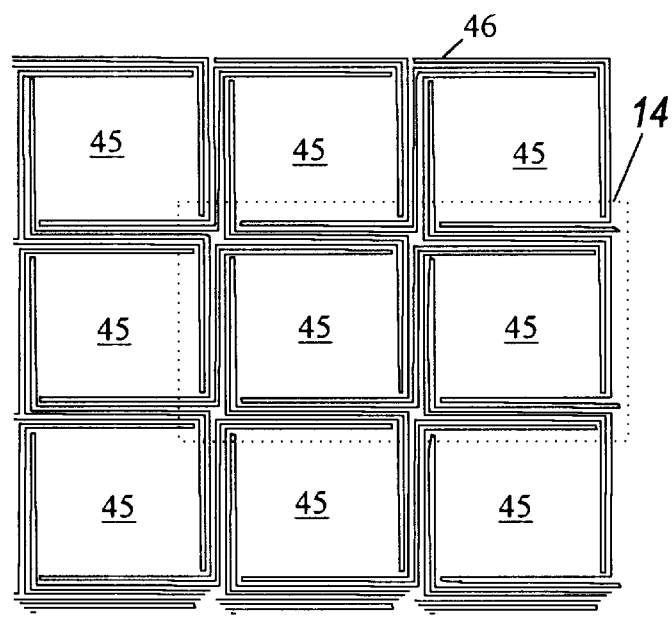
FIG. 13 shows an embodiment of the invention, used in a two-dimensional unlatticed array.

To achieve a similar flexibility in 2 dimensions we can form an array of trenches (46) that delineate thin, bent interconnections between the arrayed islands (45), as shown in FIG. 13.

Figure 14:
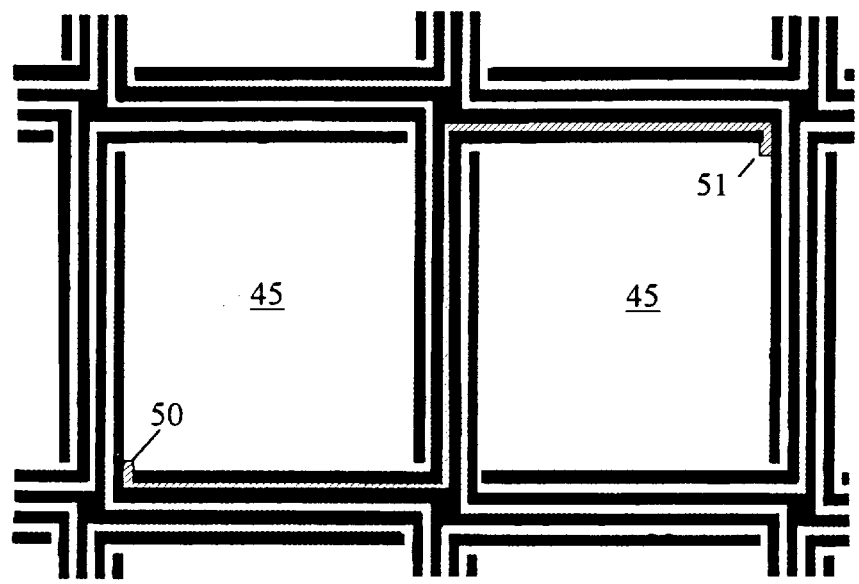
FIG. 14 is a close-up view of the area shown in dotted lines labeled 14 in FIG. 13, with the gaps in the sheet emphasized.

Although we have indicated how nine square islands (45) could be interconnected, actual arrays are generally expected to be much more numerous. FIG. 14 is an enlargement of a section (represented by the dotted rectangle labeled 14) consisting of slightly more than two square islands in FIG. 13. It is also easier to see which areas are the trenches when one fills in those regions as done in the enlargement. In this enlargement two comers are indicated, (50) and (51). One can see that there is indeed an S-shaped strip in this detail by the hatched area connecting these two corners.

This strip of material runs (or connects) these two comers together. From symmetry, we realize that there are similar thin S-shaped strips that connect each square (45) to its four neighbors throughout the array (except, of course, for the squares at the very edge of the array). These S-shaped strips are the "springs" that need exist between the neighbors in an unlatticed flexible array. These strips optionally allow electrical conductors to be affixed to provide electrical interconnection between islands.

The stiffness of the springs depends upon their shape, their segment lengths, the thinness of the strips and the construction of the "joints" (where straight sections merge). If the joints do not flex then the spring-action depends upon bending and shearing of the long sections. There is a tendency to build up stress at the joints so they should either be strengthened by increasing the thickness there or they should be made more flexible by thinning. To reduce the chances of cracking, one should radius the inside corners of bends.

The range of motion possible is obviously related to the width of the trenching and to the number of trenches. With a well designed structure, the width of each trench expands or shrinks to accommodate flexing. Where more compression is needed, more trench width should be supplied.

While the previous example has shown a sheet in which the elements or islands of the two-dimensional array are similarly shaped (i.e. rectangular), with each island being connected to the immediately adjacent rectangles, it will be recognized that this is not a necessary part of the invention. A sheet could be formed with two kinds of islands, each being connected to a number of other islands of both kinds. For example, if there were two kinds of islands (call them $\alpha$ and $\beta$), each $\alpha$ could be connected by narrow strips to 6$\beta$, and each $\beta$ in turn connected by narrow strips to 3$\alpha$.

Figure 15:
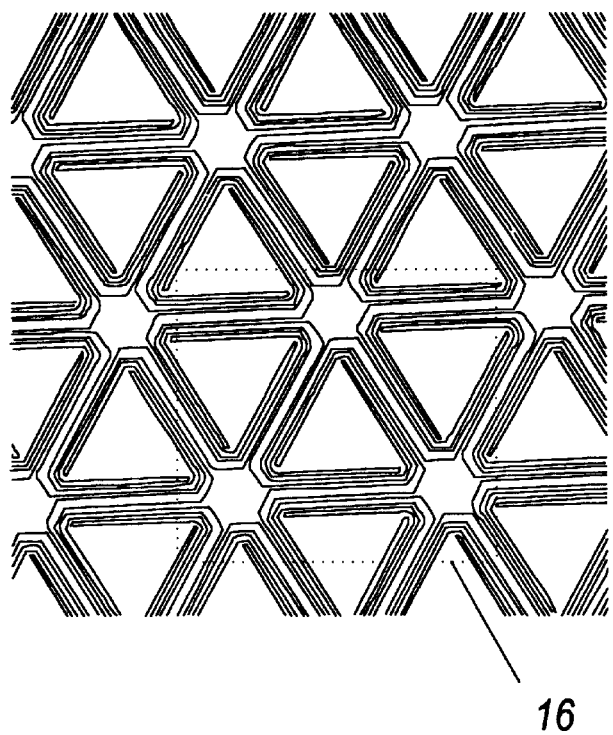
FIG. 15 shows an alternate embodiment of the invention, in which the array elements are hexagonally symmetrical.
Figure 16:
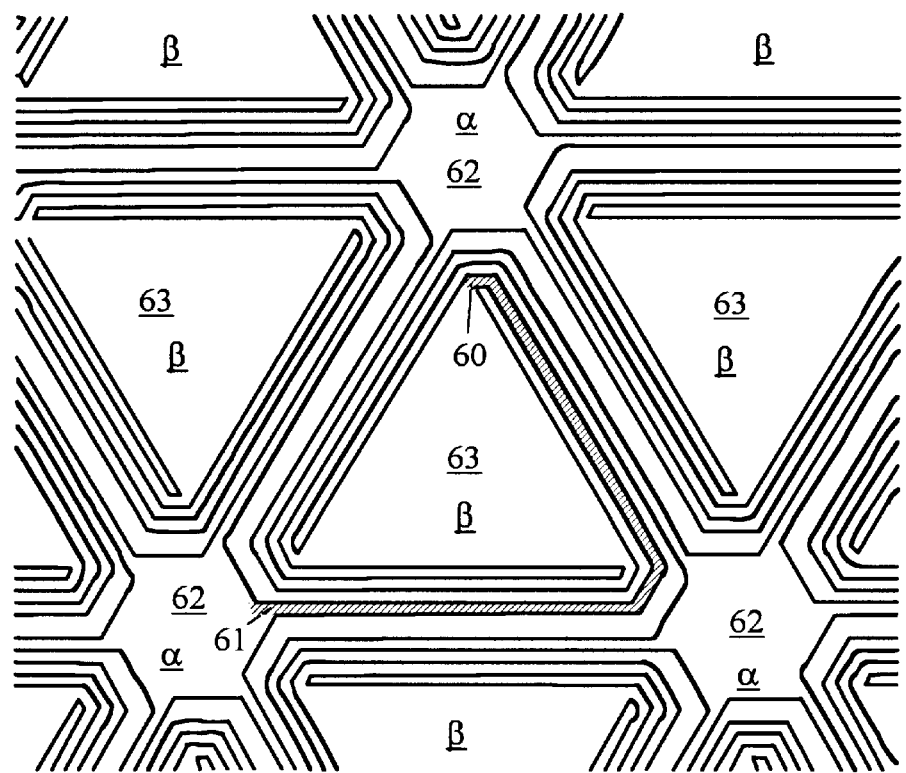
FIG. 16 is a close-up view of the area shown in dotted lines labeled 16 in FIG. 15.

FIG. 15 is an example of a hexagonally symmetrical flexible sheet conforming to this example. FIG. 16 is an enlargement of the area surrounded by dotted rectangle 16 in FIG. 15 to more conveniently see the alteration of trenches and strips.

Again we have marked off two points as (60) and (61). Point (60) lies on a triangular region (corresponding to islands of type $\beta$), for which the pattern is three-fold rotationally symmetric. Point (61) lies, instead, on a roughly hexagonal region (corresponding to islands of type $\alpha$), for which the pattern is six-fold rotationally symmetric. We see that there is a bent strip of material (shaded) connecting point (60) to point (61). By symmetry we see (aside from edges of the pattern) that each triangular region is flexibly directly connected to its three nearest hexagonal regions. Also, by symmetry, each hexagonal region is flexibly directly connected to its 6 nearest triangular regions. Thus we have each region connected flexibly to each neighboring regions and there is no stiff lattice to contend with.

It should be noted that where the dimensions of the islands in the array is much greater than the dimensions of the elements contained in the islands (for example, lenses, laser diodes, etc.), then the symmetry of the island placement may be different than the symmetry of the elements.

Figure 17A:
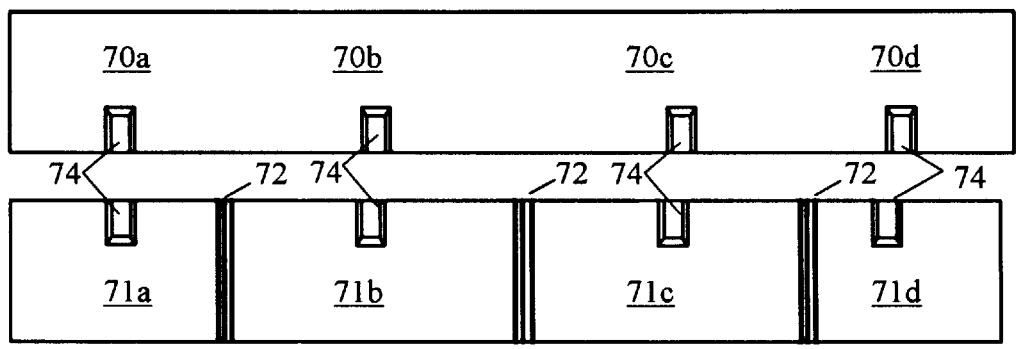
FIGS. 17a and 17b show the invention in use in registration of two mating structures.
Figure 17B:
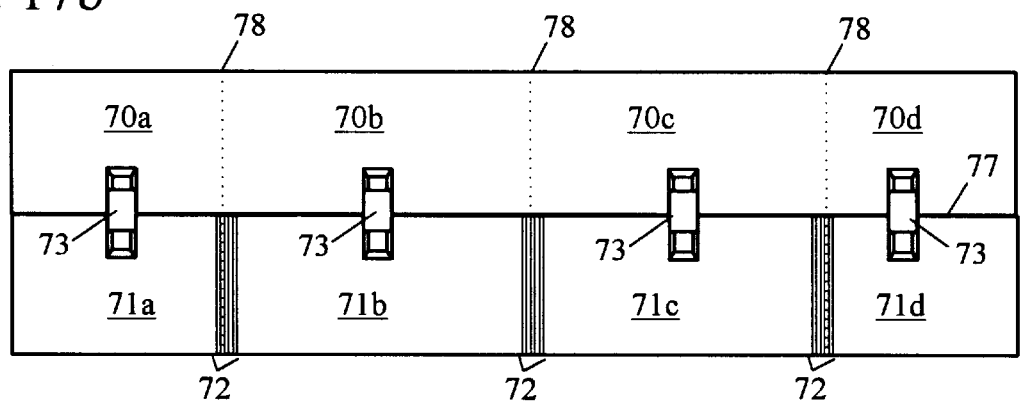

FIGS. 17a and 17b show how the invention may be used to fit together two strips of material containing electro-optical devices, which will then be fixed together with pins (73). The strips are shown with four devices on each strip, denoted (a) to (d), although more or fewer than four devices could be used in practice. No details of the devices are shown, as not relevant to this discussion.

As can be seen in FIG. 17a, a number of electro-optical devices (70a)–(70d) and (71a)–(71d) are fabricated on each strip of material. The mating devices (70a)/(71a), (70b)/(71b), (70c)/(71c) and (70d)/(71d) need to be aligned to each other, for example, if the devices were laser diodes and photoreceptors. Slots (74) are provided within which pins (73) can be set to fasten the two strips together. As can be seen, because of manufacturing tolerances (exaggerated here to make the effect clearer), when the first devices (70a)/(71a) are aligned, the succeeding devices down the strips are increasingly out of alignment.

Trenches (72) are made between the devices. In FIG. 17b, it can be seen how, by adjusting the strips using the flexible regions formed by the trenches (72), the devices can be moved into alignment, and the pins (73) placed.

If desired, the strips can be fastened together by adhesive along juncture (77), and then cut along lines (78) and through the flexible regions to form a number of combined devices.

Figure 18:
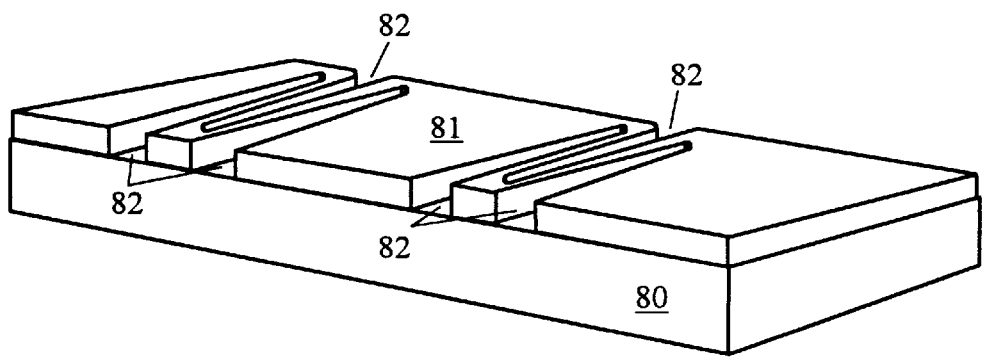
FIG. 18 shows how the method of the invention may be used in matching two laminated layers of material.

FIG. 18 shows how the invention may be used to align devices on two laminations (80) and (81) fastened together one-upon-the-other. As can be seen, the top lamination (81) is trenched (82), forming flexible regions which allow devices on the upper lamination (81) (say lenses) to be moved into alignment to devices upon the lower lamination (80) (say, VCSELs).

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

What is claimed is:

1. An integrated device comprising a flexible sheet having a plurality of electro-optical elements spaced apart thereon, comprising:
    a sheet comprising substantially rigid material having the electro-optical elements thereon;
    a plurality of flexible zones located adjacent to the electro-optical elements, each flexible zone comprising a plurality of trenches cutting at least partially through the sheet and the strips of material between the trenches;
    such that the flexible zones create a plurality of substantially rigid islands having the electro-optical elements thereon, the islands being movable relative to each other.

2. The device of claim 1, in which the sheet is an elongated strip of material having the elements disposed in a linear array thereupon.

3. The device of claim 2, in which the trenches in the flexible zones are oriented transversely to the linear array of elements on the strip.

4. The device of claim 3, in which the trenches are in the form of chevrons.

5. The device of claim 2, in which the trenches form at least one dovetail, such that two adjoining island are locked together.

6. The device of claim 2 in which the trenches are bent, such that at least part of the trench is formed parallel to the linear array of elements.

7. The device of claim 6, in which the trenches are bent adjacent to the edges of the sheet, such that the ends of the trenches are parallel to the edges of the sheet.

8. The device of claim 2, in which the trenches surround substantially all of at least one element in the array.

9. The device of claim 1, in which the elements are disposed in a two-dimensional array on the sheet.

10. The device of claim 9, in which the trenches are in the form of spirals substantially surrounding at least one island, the spirals being spaced apart such that a lattice of rigid material is formed between the islands, and the elements on the islands are relatively movable relative to the lattice.

11. The device of claim 9, in which the trenches substantially surround the islands, and the strips of material between the trenches form bent strips, connecting one island to an adjacent island.

12. The device of claim 11, in which the bent strips connect one corner of one island to a corner of an adjacent island.

13. The device of claim 11, in which the islands are rectangular.

14. The device of claim 11, in which the islands are of two types, $\alpha$ and $\beta$, and each $\alpha$ island is flexibly connected to six $\beta$ islands, and each $\beta$ island is flexibly connected to three $\alpha$ islands.

15. The device of claim 14, in which the sheet is hexagonally symmetrical, and the islands comprise three-fold rotationally symmetric trangular regions and six-fold rotationally symmetric hexagonal regions, and the triangular regions being flexibly connected to the three nearest hexagonal regions, and the hexagonal regions being flexibly connected to the six nearest triangular regions.

16. The method of constructing a flexible sheet having a plurality of electro-optical elements spaced apart thereon, comprising the steps of:
    selecting a rigid sheet having a plurality of electro-optical elements spaced apart thereon;
    forming a plurality of trenches through the sheet between at least two of the electro-optical elements, the plurality of trenches enclosing thin strips of material therebetween, such that the trenches and the thin strips of material between the trenches form a flexible zone between the electro-optical elements on substantially rigid islands, the islands being movable relative to each other.

17. The method of claim 16, in which the sheet is an elongated strip of material having the elements disposed in a linear array thereupon.

18. The method of claim 17, in which the trenches in the flexible zones are oriented transversely to the linear array of elements on the strip.

19. The method of claim 17, in which the trenches are in the form of chevrons.

20. The method of claim 17, in which the trenches form at least one dovetail, such that two adjoining island are locked together.

21. The method of claim 17 in which the trenches are bent, such that at least part of the trench is formed parallel to the linear array of elements.

22. The method of claim 21, in which the trenches are bent adjacent to the edges of the sheet, such that the ends of the trenches are parallel to the edges of the sheet.

23. The method of claim 16, in which the trenches surround at least one element in the array.

24. The method of claim 16, in which the elements are disposed in a two-dimensional array on the sheet.

25. The method of claim 24, in which the trenches are in the form of spirals substantially surrounding at least one island, the spirals being spaced apart such that a lattice of rigid material is formed between the islands, and the islands are relatively movable relative to the lattice.

26. The method of claim 24, in which the trenches surround the islands, and the strips of material between the trenches form bent strips, connecting one island to an adjacent island.

27. The device of claim 26, in which the bent strips connect one corner of one island to a corner of an adjacent island.

28. The method of claim 24, in which the islands are rectangular.

29. The method of claim 24, in which the islands are of two types, $\alpha$ and $\beta$, and each $\alpha$ island is flexibly connected to six $\beta$ islands, and each $\beta$ island is flexibly connected to three $\alpha$ islands.

30. The method of claim 29, in which the sheet is hexagonally symmetrical, and the islands comprise three-fold rotationally symmetric triangular regions and six-fold rotationally symmetric hexagonal regions, and the triangular regions being flexibly connected to the three nearest hexagonal regions, and the hexagonal regions being flexibly connected to the six nearest triangular regions.

* * * * *